United States Patent [19]
Yanase

[11] 4,246,044
[45] Jan. 20, 1981

[54] METHOD FOR FABRICATING SEMI-CONDUCTOR DEVICES

[75] Inventor: Toshinobu Yanase, Kamakura, Japan

[73] Assignee: Tokyo Shibaura Denki Kabushiki Kaisha, Kawasaki, Japan

[21] Appl. No.: 54,946

[22] Filed: Jul. 5, 1979

[51] Int. Cl.³ .............................................. H01L 21/26
[52] U.S. Cl. .................................... 148/1.5; 148/187; 29/571
[58] Field of Search .................... 148/1.5, 187; 29/571

[56] References Cited

U.S. PATENT DOCUMENTS

| 3,966,501 | 6/1976 | Nomura et al. ................. 148/187 X |
| 4,033,026 | 7/1977 | Pashley ................................. 29/571 |
| 4,039,358 | 9/1976 | Kitajima et al. ...................... 148/187 |

*Primary Examiner*—G. Ozaki
*Attorney, Agent, or Firm*—Oblon, Fisher, Spivak, McClelland & Maier

[57] ABSTRACT

A process for fabricating semi-conductor devices, such as depletion mode MOS transistors, including the process of doping impurities in to the semi-conductor substrate by using a newly provided oxide layer as a doping mask, and thereafter providing a gate oxide layer. A desired gate threshold voltage is thereby reliably obtained.

5 Claims, 20 Drawing Figures

METHOD FOR FABRICATING SEMI-CONDUCTOR DEVICES

BACKGROUND OF THE INVENTION

1. Field of the Invention

This invention relates to the method for fabricating semi-conductor devices, especially MOS devices, such as depletion mode MOS transistors.

2. Description of the Prior Art

A conventional manufacturing method for producing D-mode MOS transistor devices such as an E/D inverter is explained by reference to FIG. 1 to FIG. 8. As is shown in FIG. 1, a P-type silicon substrate 1 is provided. The silicon substrate 1 is oxidized to form a silicon oxide layer 2. Then by using conventional vapor phase deposition, silicon nitride layer 3 is deposited on the surface of silicon oxide layer 2. Next, on the surface of silicon nitride layer 3, a photoresist layer is provided. Then by using a conventional photo-engraving process, a desired resist pattern 4 is formed.

As is shown in FIG, 2, by using this photoresist pattern 4, a silicon nitride layer 3 is etched off to form silicon nitride layer patterns 3'. Thereafter, photoresist pattern 4 is removed and by using silicon layer pattern 3' as a mask, the whole substrate is heat-treated in a wet oxide atmosphere, thus forming field oxide layer S. In this process later mentioned nitride involved layer 5 as is shown in FIG. 3 is formed just underneath silicon oxide layer 2. Then as is shown in FIG. 4 silicon nitride pattern 3' is removed. Then, a selected part of the silicon oxide layer 2 and part of field oxide layer 5 is selectively etched off to form windows for impurity doping. Through these windows impurities, for example arsenic ions, are ion-implanted.

As is shown in FIG. 5, n layer 6 is formed to control the threshold value of n channel D-mode MOS transistor. After removing silicon oxide layer 2, gate oxide layer 7 is newly formed as is shown in FIG. 7. After that, forming of the gate electrode, diffusion, provision of the insulating layer, forming the contact hole through the insulating layer, metallization and forming of a protection layer are done and an E/D inverter using D-mode MOS semi-conductor devices is completed. In FIG. 8, the numerals 9a, 10a and 10b designate portions of an enhancement mode (E-mode) MOS transistor, wherein 10a is the source, 9a is the gate electrode, and 10b is the drain of this E-mode transistor. Also 9b, 10b and 10c designate portions of a D mode MOS transistor, wherein 9b is the gate electrode and 10b is the source of this D-mode transistor and 10c is the drain. In the channel, region 7 doped with N-type impurity exists. Then through insulating layer 11, electrodes 12a, 12b, 12c and 12d to each region are formed. Electrodes 12a, 12b, 12c and 12d are, for example, made of aluminum. The whole surface is covered with a protection layer 13.

One of the disadvantages of this conventional method is the difficulty in providing a reliable silicon oxide layer 2 as a mask for doping impurities. This is mainly because of the fact that there is no ideal selective etching method for removing the silicon nitride layer 3' without attacking the silicon oxide layer 2. For example, even by using plasma etching, the etching ratio is 4:1. Besides that, when removing the silicon nitride layer 3', the etching rate or etching speed is different within wafers or among lots. Furthermore, the determination of the end of the etching period is very difficult, so normally the etching time is a little prolonged. Because of this, the silicon oxide layer 2 often becomes thinner than the desired value, whereupon this silicon oxide layer 2 may no longer function effectively as an impurity doping mask.

Another disadvantage is a phenomenon so-called white ribbon which is discussed in Journal of Electrochemical Society, Solid State Science and Technology, Vol. 123, No. 7, July 1976, pages 1117 to 1120.

SUMMARY OF THE INVENTION

Accordingly, it is an object of this invention to provide an improved method for fabricating semiconductor devices, such as MOS semiconductor devices.

Another object of the invention is to provide an improved method for fabricating semiconductor devices exhibiting a controlled threshold voltage.

A further object of the invention is to provide an improved method for fabricating semiconductor devices by using an ion implantation process.

Yet another object of the invention is to provide an improved method for fabricating semiconductor devices.

These and other objects are achieved by providing a novel method for fabricating semiconductor devices, comprising the steps of forming a first oxide layer on a semiconductor substrate; forming a silicon nitride layer pattern on the first oxide layer; thermally oxdizing the substrate to form a field oxide layer by using the silicon nitride layer as a mask; removing the silicon nitride layer and the first oxide layer underneath the silicon nitride layer to reveal a portion of the substrate; forming a second oxide layer in the revealed portion; etching off a part of the second oxide layer to form a window for doping selected impurities; doping the selected impurities through the window; and removing the second oxide layer and newly forming a third oxide layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

Figure 1:
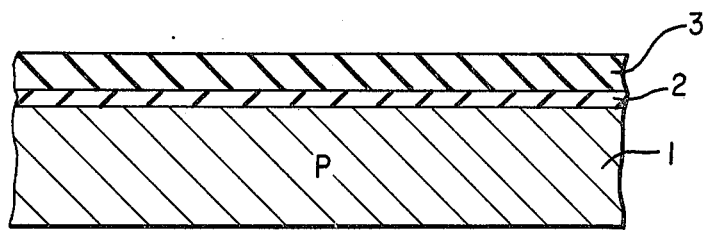
FIG. 1–FIG. 8 are cross-sectional views of the conventional silicon MOS transistors during various stages of the fabricating process.
Figure 2:
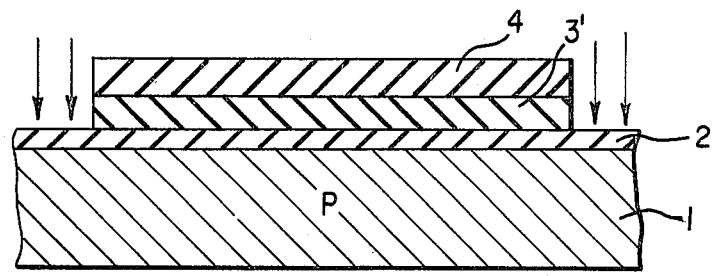
Figure 3:
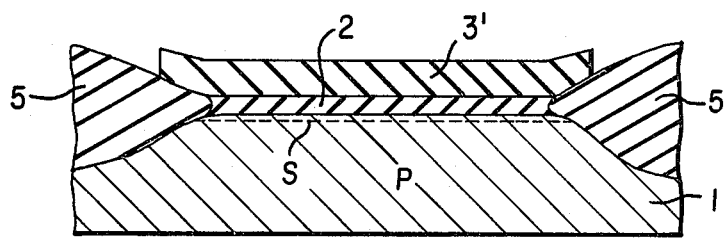
Figure 4:
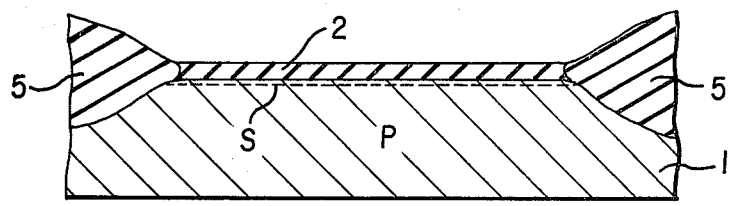
Figure 5:
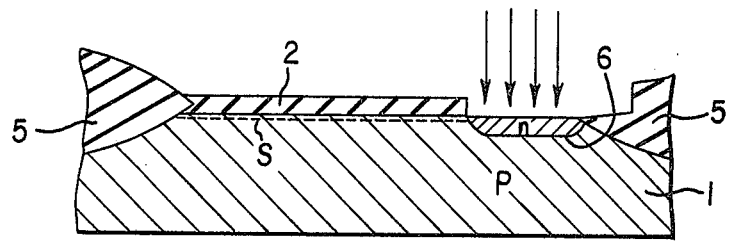
Figure 6:
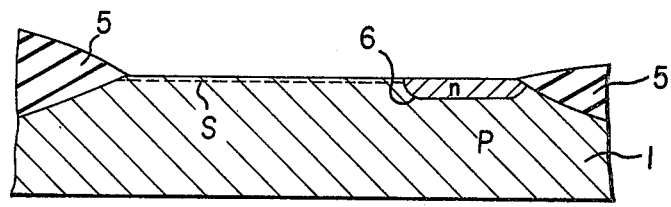
Figure 7:
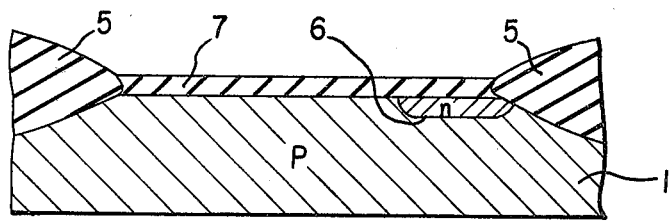
Figure 8:
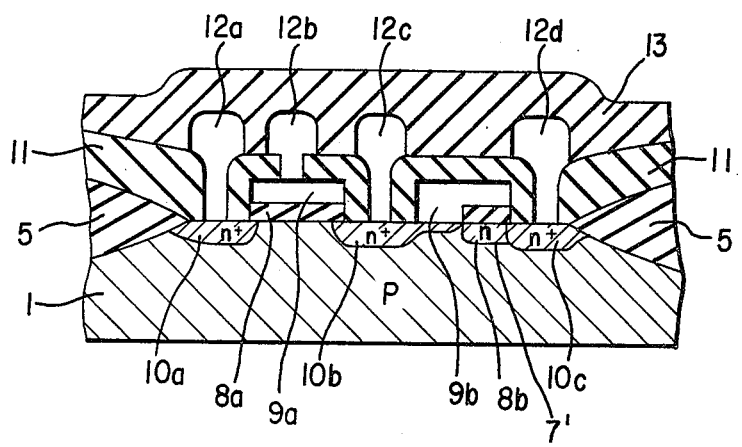

The figures are diagrammatic and not drawn to scale.

DESCRIPTION OF THE PREFERRED EMBODIMENTS

Referring now to the drawings, wherein like reference numerals designate identical or corresponding parts throughout the several views, and more particularly to FIGS. 9–18 thereof, one of the suitable embodiments of this invention, for example an E/D inverter including a D-mode MOS semiconductor device fabricating method, is explained.

Figure 9:
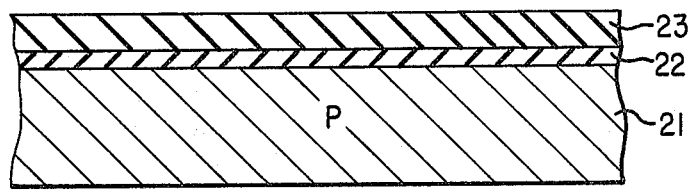
FIG. 9–FIG. 18 are cross-sectional view of a semiconductor device at each manufacturing step according to the present invention.
Figure 10:
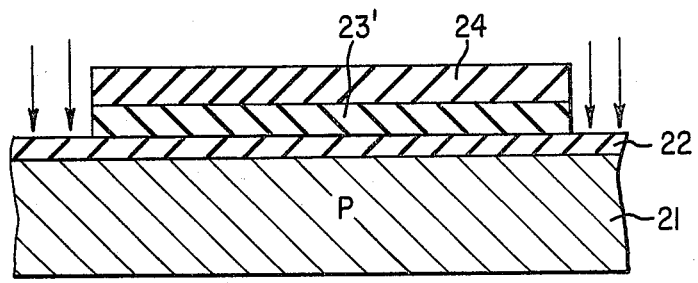
Figure 11:
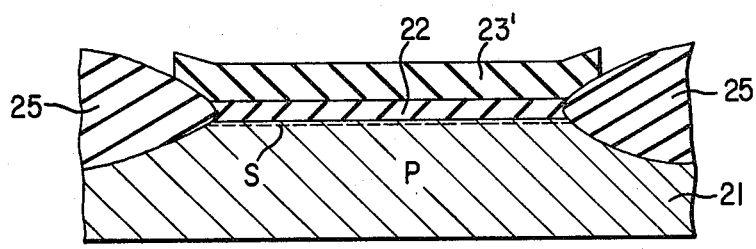
Figure 12:
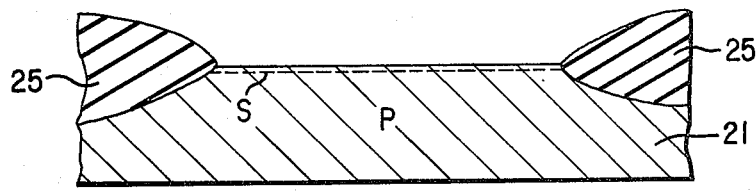
Figure 13:
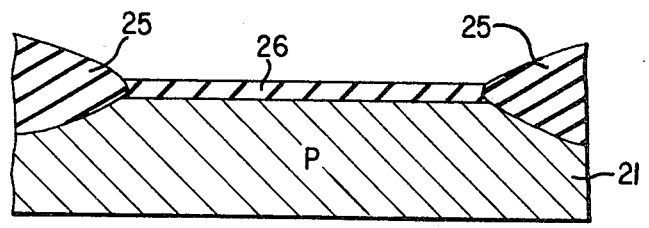
Figure 14:
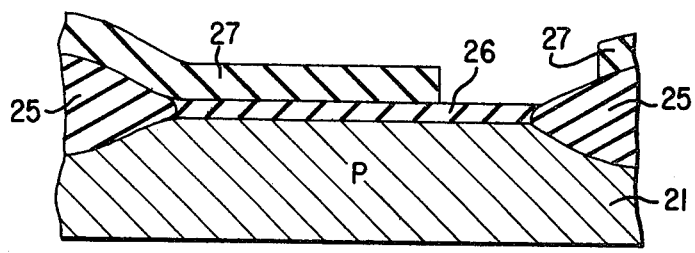
Figure 15:
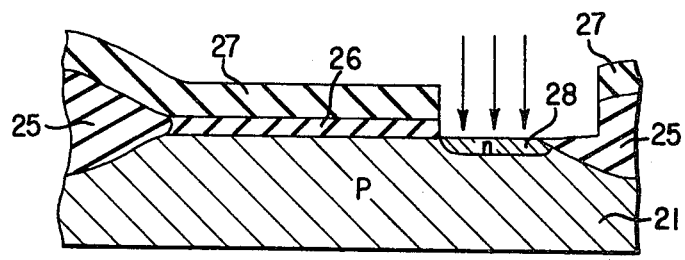
Figure 16:
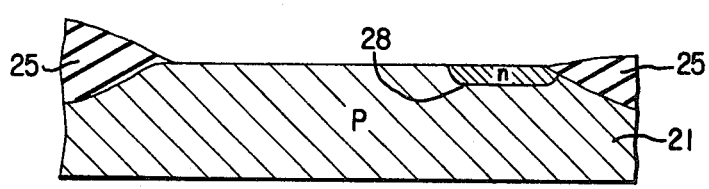
Figure 17:
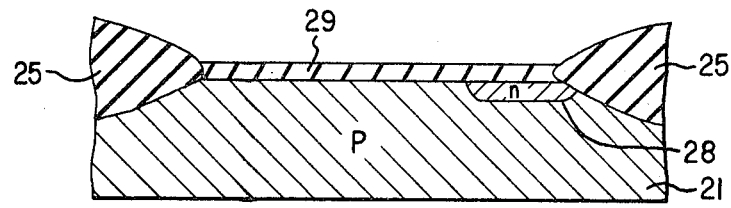

Firstly, as is shown in FIG. 9, a P-type silicon substrate 21 which has resistivity of 5 ohm-cm is provided. This substrate 21 can be bulk silicon, or formed by a semiconductor epitaxial layer. This substrate 21 is oxidized to form a first oxide layer 22. This oxidation is done under the temperature of for example 1000° C. and the thickness of this silicon oxide layer 22 is for example 300 Å. On this silicon oxide layer 22 silicon nitride layer 23, which has for example the thickness of 3000 Å is deposited. The deposition of the silicon nitride layer 23 is done by using normal vapor-phase deposition of $SiH_4$ and $NH_3$. After that upon this silicon nitride layer 23, a photoresist layer which has for example the thickness of 1 μm is provided and photoengraved to form photoresist patern 24. By using this photoresist pattern 24 as a mask, the silicon nitride layer is selectively etched by using $CF_4$ gas and thus a silicon nitride pattern 23' is formed as is shown in FIG. 10. After that, boron ion $B^+$ is ion-implanted with the acceleration voltage 120 KeV and the dose quantity is $2.2 \times 10^{13}/cm^2$. After the implantation process, the photoresist pattern 24 is removed and under a temperature of for example 100° C., the whole substrate is oxidized under a wet oxidizable atmosphere for 5 hours thus forming the field oxide layer 25 as shown in FIG. 11. In this process, the silicon nitride pattern 23' works as an oxidation mask and unfavorable nitride involved layer S is formed just underneath the first oxide layer 22. After this, silicon nitride pattern 23' is removed by using plasma etching and the silicon oxide layer 22 is removed by using buffered HF to reveal the surface of silicon substrate 21 as shown in FIG. 12. After revealing the surface of silicon substrate 21 the while substrate is heat-treated under dry oxide under a temperature of 1000° C. to form a second oxide layer 26 which involves nitride and has a thickness of for example 500 Å as shown in FIG. 13. After this step, a photoresist layer 27 is deposited on the oxide layer 26 and the field oxide layer 25, and by using a photoengraving method, part of the photoresist layer 27 is removed as shown in FIG. 14. From this removed part later mentioned ion implantation is done. Then, a selected part of the oxide layer 26 and field oxide layer 25 is selectively etched off by using photoresist pattern 27 as a mask. An etching solution of buffered HF is used. From the removed part impurity ions, for example, arsenic ions, are implanted with an acceleration voltage of 60 KeV and a dose quantity of $1 \times 10^{12}/cm^2$ forms the channel region 28 as shown in FIG. 15. After removing photoresist pattern 27 oxide layer 26 is also removed as is shown in FIG. 16. After this step a newly provided oxide layer which will serve as a gate oxide layer 29 is formed as shown in FIG. 17. This oxide layer 29 is formed under a temperature of 1000° C. in a dry oxygen atmosphere and the thickness of this layer is selected for example as 800 Å. After this process, conventional methods to form gate electrode, N+ source, N+ drain, insulating layer, contact hole, metallization and protection layer are used. Thus, the E/D inverter having D-mode MOS semiconductor device 35 is obtained as in shown in FIG. 18.

Figure 18:
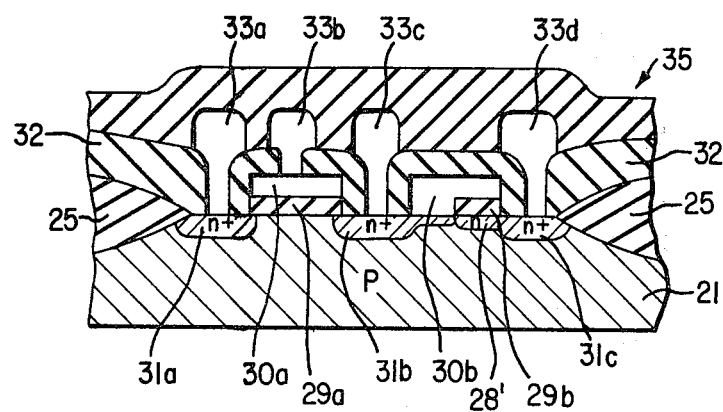

In FIG. 18, the numerals 29a, 30a, 31a, and 31b designate portions of an E-mode MOS transistor, wherein 29a is a gate oxide layer which has a thickness of 800 Å. 30a is the gate electrode formed of for example polysilicon and having a thickness of, for example, 3700 Å, 31a is the source of this transistor and 31b is the drain of this transistor. The numerals 29b, 30b, and 31c designate portions of a D-mode MOS transistor, wherein 29b is a gate oxide layer and 30b is the gate electrode, 31b is this time the source of this D-mode transistor and 31c is the drain of this transistor. In the D-mode MOS transistor a channel portion 28' is formed. On the whole surface, a phosphosilicated glass layer 32 is deposited. Through the contact hole formed in the insulating layer 32, metallization layer 33a, 33b, 33c and 33d is formed. On the whole device surface, a protection layer such as silicon nitride layer 35 is deposited.

Figure 19:
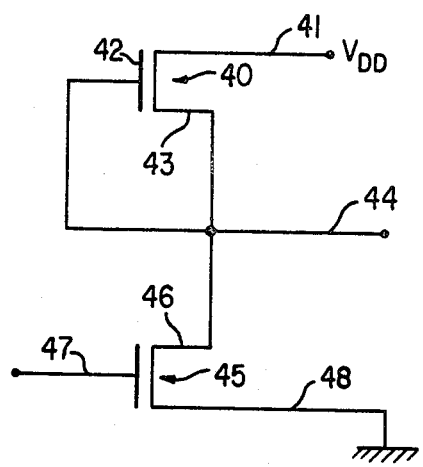
FIG. 19 is the circuit diagram of an E/D inverter produced according to the method of this invention; and, FIG. 20 is a diagram showing the relationship between ion dose quantity and threshold voltage.

In FIG. 19 is shown the circuit diagram of the E/D inverter according to this embodiment. The drain 41 of the D-mode n-channel MOS transistor 40 which functions as a load transistor is connected to the power source $V_{DD}$. The gate 42 and the source 43 are commonly connected to the output point 44. The drain 46 of the E-mode n-channel MOS transistor 45 which functions as a drive transistor is connected to the output point 44 and the gate 47 is connected to the input and the source 48 is connected to the ground.

Figure 20:
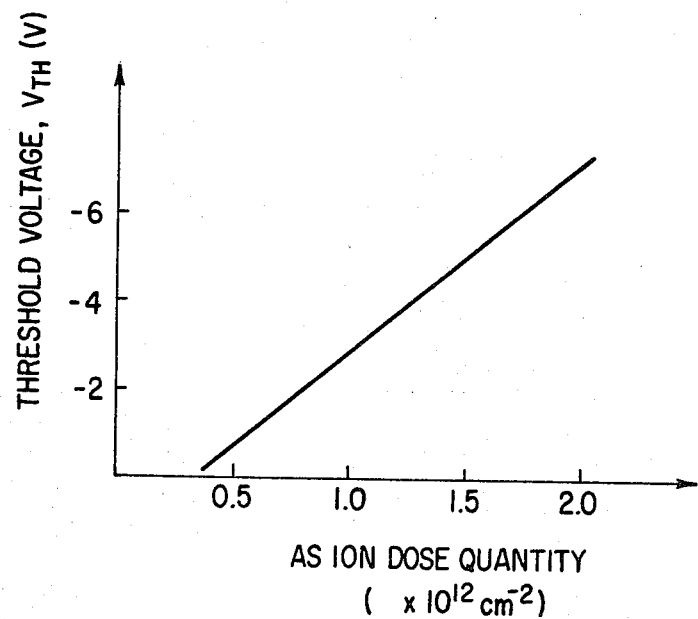

The threshold voltage $V_{TH}$ of the D-mode n-channel MOS transistor is quite linearly obtained as is seen in FIG. 20 in relation to the As ion dose quantity. Arsenic ion is implanted with the acceleration voltage of 60 KeV and the thickness of the gate oxide layer is 800 Å. If an acceleration voltage of for example 20 KeV, 60 KeV, 150 KeV is used, the respective minimum thickness of silicon oxide layer as a mask for arsenic ion implantation is 170 Å, 230 Å, 400 Å, 900 Å, respectively.

In the above embodiment photoresist 27 is also used in the ion implantation process, but ion implantation can be also done without photoresist layer 27.

In the above embodiment arsenic ion implantation is used but other impurities, for example antimony Sb can be used to control the threshold voltage. Boron and arsenic as two impurity sources can be used to form an I-type region in the substrate to control the threshold voltage. Doping methods cannot be restricted to the ion implantation but also conventional diffusion method is used.

This invention is also available to P-channel MOS transistor or complementary MOS transistors.

The device obtained according to the method of the invention exhibits the desired threshold voltage with an adequate gate oxide layer breakdown voltage, thus resulting in the achievement of high yield production of MOS transistors. According to this invention, there is provided an improved manufacturing method for a semiconductor device requiring the accurate threshold voltage control which utilizes the impurity doping in the channel region. This invention enables the accurate threshold voltage control and also the good qualities of the gate oxide layer. Because of the newly provided oxide layer, reliable ion implantation is possible and the freedom of design is increased to yield high reliability semiconductor devices.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for fabricating semiconductor devices, comprising the steps of:
   forming a first oxide layer on a semiconductor substrate of one conductivity type;

forming a silicon nitride layer pattern on the first oxide layer;

thermally oxidizing the substrate to form a field oxide layer by using said silicon nitride layer as a mask;

removing said silicon nitride layer and said first oxide layer underneath said silicon nitride layer to reveal a portion of said substrate;

forming a second oxide layer in the revealed portion by thermal oxidation;

etching off a part of the second oxide layer to form a window for impurities doping;

doping selected impurities through the window by using ion implantation to form a channel region;

removing the second oxide layer and newly forming a third oxide layer on the revealed portion of said substrate by thermal oxidation;

forming a gate electrode on the third oxide layer; and forming a source region and a drain region of opposite conductivity type adjoining the channel region in the substrate;

wherein the third oxide layer which serves as a gate oxide layer, the gate electrode, the source region and the drain region constitute a depletion mode MOS transistor.

2. A method for fabricating semiconductor devices according to claim 1, wherein said selected impurities are of a type different from the impurities of the substrate.

3. A method for fabricating semiconductor devices according to claim 2, wherein said selected impurities are of a type opposite from the impurities of the substrate.

4. A method for fabricating semiconductor devices according to claim 1, wherein said selected impurities are arsenic ions.

5. A method for fabricating semiconductor devices according to claim 4, wherein said second oxide layer thickness is more than 170 Å.

* * * * *

UNITED STATES PATENT AND TRADEMARK OFFICE
CERTIFICATE OF CORRECTION

PATENT NO. : 4,246,044

DATED : January 20, 1981

INVENTOR(S) : Toshinobu Yanase

It is certified that error appears in the above-identified patent and that said Letters Patent is hereby corrected as shown below:

On the title page Insert:

-- (30) Foreign Application Priority Data

July 5, 1978 (JP) Japan----------53-81548 --.

Signed and Sealed this

Thirteenth Day of September 1983

[SEAL]

Attest:

GERALD J. MOSSINGHOFF

Attesting Officer

Commissioner of Patents and Trademarks